United States Patent
Konda

(10) Patent No.: US 9,054,260 B2
(45) Date of Patent: *Jun. 9, 2015

(54) RADIATION DETECTING ELEMENT AND RADIATION DETECTING DEVICE

(71) Applicant: Takehisa Konda, Miyagi (JP)

(72) Inventor: Takehisa Konda, Miyagi (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/167,075

(22) Filed: Jan. 29, 2014

(65) Prior Publication Data

US 2014/0312442 A1    Oct. 23, 2014

Related U.S. Application Data

(62) Division of application No. 13/321,246, filed as application No. PCT/JP2010/058295 on May 17, 2010, now Pat. No. 8,674,358.

(30) Foreign Application Priority Data

May 19, 2009 (JP) ................... 2009-120963

(51) Int. Cl.
H01L 33/02 (2010.01)
H01L 31/08 (2006.01)
G01T 1/20 (2006.01)
H01L 31/108 (2006.01)
H01L 31/115 (2006.01)
G01T 1/24 (2006.01)

(52) U.S. Cl.
CPC ............ *H01L 31/085* (2013.01); *G01T 1/2018* (2013.01); *H01L 31/1085* (2013.01); *H01L 31/115* (2013.01); *G01T 1/249* (2013.01)

(58) Field of Classification Search
CPC .............. H01L 27/14643; H01L 27/14659; H01L 27/14649
USPC ..................... 257/53, 428, E21.211
See application file for complete search history.

(56) References Cited

U.S. PATENT DOCUMENTS 4,782,377 A    11/1988 Mahan
4,914,042 A    4/1990 Mahan
(Continued)

FOREIGN PATENT DOCUMENTS

JP    60-070774    4/1985
JP    03-248578    11/1991
(Continued)

OTHER PUBLICATIONS

International Search Report, PCT/JP2010/058295, Jul. 13, 2010.

*Primary Examiner* — Michael Lebentritt
(74) *Attorney, Agent, or Firm* — Young & Thompson

(57) ABSTRACT

There has been such a problem that radiation detecting elements using semiconductor elements have a low radiation detection efficiency, since the radiation detecting elements easily transmit radiation, even though the radiation detecting elements have merits, such as small dimensions and light weight. Disclosed are a radiation detecting element and a radiation detecting device, wherein a film formed of a metal, such as tungsten, is formed on the radiation incident surface of the radiation detecting element, and the incident energy of the radiation is attenuated. The efficiency of generating carriers by way of radiation incidence is improved by attenuating the incident energy, the thickness of the metal film is optimized, and the radiation detection efficiency is improved.

10 Claims, 9 Drawing Sheets

(56) References Cited

U.S. PATENT DOCUMENTS

| | | |
|---|---|---|
| 4,940,898 A | 7/1990 | Mahan |
| 5,471,948 A | 12/1995 | Burroughes et al. |
| 5,880,490 A | 3/1999 | Antich et al. |
| 6,255,708 B1 | 7/2001 | Sudharsanan et al. |
| 6,407,374 B1 | 6/2002 | Sato et al. |
| 6,486,476 B1 | 11/2002 | Ochiai et al. |
| 8,674,358 B2 * | 3/2014 | Sasaki .................... 257/53 |
| 2002/0113250 A1 | 8/2002 | Chaiken et al. |
| 2005/0118736 A1 | 6/2005 | Akita et al. |
| 2007/0176200 A1 | 8/2007 | Hatanaka et al. |
| 2009/0014757 A1 | 1/2009 | Takulapalli et al. |
| 2009/0179155 A1 | 7/2009 | Weinberg |
| 2009/0218649 A1 | 9/2009 | Mijares et al. |
| 2009/0250630 A1 | 10/2009 | Van Der Zaag et al. |
| 2010/0264459 A1 | 10/2010 | Ueno et al. |
| 2011/0079729 A1 | 4/2011 | Partain et al. |
| 2012/0161266 A1 | 6/2012 | Christophersen et al. |

FOREIGN PATENT DOCUMENTS

| | | |
|---|---|---|
| JP | 08-236799 | 9/1996 |
| JP | 2000-244003 | 9/2000 |
| WO | WO 03/094223 | 11/2003 |

* cited by examiner

RADIATION DETECTING ELEMENT AND RADIATION DETECTING DEVICE

CROSS REFERENCE TO RELATED APPLICATIONS

This application is a division of application Ser. No. 13/321,246 filed on Feb. 14, 2012, which is a National Stage of PCT/JP2010/058295 filed on May 17, 2010, which claims foreign priority to Japanese Application No. 2009-120963 filed on May 19, 2009. The entire contents of each of the above applications are hereby incorporated by reference.

TECHNICAL FIELD

The present invention relates a radiation detecting element, an image diagnosis device and an imaging device utilized in the field of nuclear medicine, atomic energy, astronomy, and cosmic-ray physics.

BACKGROUND ART

Positron Emission Tomography (PET) is one of the nuclear medical inspection methods which measure the existence and position of the radioactivity. While the X-Ray CT measures the transmission of radiation by arranging radiation source out of analyte (human body), the PET measures the place of the radiation isotope (RI) distributed in specific internal organs within the human body by administrating radiopharmaceuticals and measuring emitted radiation. The PET utilizes the radiopharmaceuticals tagged by the RI, which releases positrons, as the radiation source. The positron annihilates by combining with electron bound near, and two strong gamma rays having strong transmission power fly in opposite directions from that point alternatively. By simultaneously counting a pair of radiations by detectors arranged around the human body, direction and location of the radiation source can be detected. Pet is a technique to reconstruct three dimensional density of the radiation source inside where the data were counted at the same time, for example cancer and general examination, brain, organs and various diagnostic like cardiac function, brain and nervous system research, and has been used inn pharmacokinetics and metabolism research.

Semiconductor elements are used as radiation detecting element for PET, compared with radiation detecting elements for scintillator and a photomultiplier tube that was conventionally used, it is small, lightweight, high image resolution characterized by direct radiation converted to electrical signal, in recent year research has been developed.

FIG. 7 (a) is a cross-sectional view of a radiation detecting element using a conventional Schottky diode disclosed in Patent Document 1. On the one surface of the CdTe-type semiconductor substrate 102, electrode 101 comprised from InCdTe is formed. In the interface of the electrode 101 and the semiconductor substrate 102, a Schottky junction is formed. On the other side of the semiconductor substrate 102, the ohmic electrode 103 comprised from Pt is formed. When the bias voltage is applied so that the high potential electrode 101 to the semiconductor substrate 102, a Schottky junction becomes reverse biased. In this case, electron-hole pairs are generated in the depletion layer in the Schottky junction and the radiation incident on the semiconductor substrate 102 to move within the semiconductor substrate 102 by an electric field formed by the bias voltage. Incident radiation can be detected at high speed by measuring the current flowing between electrode 101 and the ohmic electrode 103.

PRIOR TECHNICAL DOCUMENTS PATENT DOCUMENTS

Patent Document 1: JP 2002-34400 A

SUMMARY OF THE INVENTION

Problems to be Solved by the Invention

About a conventional radiation detecting element using semiconductor element shown in FIG. 7 (a), radiation detection efficiency is low, when compared with radiation detecting elements with scintillator and photomultiplier tubes. This cause has not been fully elucidated. In particular, if the radiation detecting element used in PET, method for simultaneous detection with radiation detecting element disposed on both sides of the analyte, gamma results are released in the opposite direction, for example, For example, Sensitivity of one detector falls to half, the sensitivity of PET system falls to ¼. Signal Noise Ratio worsening, detector devices hard to refinement thus increase the resolution.

Means Solving the Problems

The Invention (1) is a radiation detecting element comprised from an intrinsic semiconductor substrate, an electrode arranged in the radiation incident side on the intrinsic semiconductor substrate, and an n-type semiconductor region or a p-type semiconductor region arranged in the opposite side, wherein the electrode is a metal film or a laminated film including metal film.

The invention (2) is the radiation detecting element according to the invention (1), wherein by defining x (cm) as the thickness of the metal film, a (1/cm) as the mass attenuation of the metal and b (cm) as the mean range of the generated recoil electron in the metal, the thickness x (cm) is arranged in the range of half-width of the approximated radiation detection efficiency $y=(1-\exp(-a*x))*\exp(-b*x)$ of the radiation detecting element.

The invention (3) is the radiation detecting element according to the invention (1) or (2), wherein the radiation is gamma ray or X-ray.

Then invention (4) is the radiation detecting element of any one of the inventions (1) to (3), wherein the metal film the metal comprised from W, Pt, In, Fe, Pb, Cu or these alloys.

The invention (5) is the radiation detecting element of any one of the inventions (1) to (3), wherein the metal film is the laminated film comprised from W/Pt, W/Fb, W/In, W/Cu or these alloys.

The invention (6) is the radiation detecting element of any one of the inventions (1) to (5), wherein the intrinsic semiconductor substrate i the substrate comprised from Si, Ge, ZnO, CdTe, CdZnTe, SiC, GaN or GaAs.

The invention (7) is a radiation detecting device which detects radiation by utilizing the radiation detecting element according to any one of the inventions (1) to (6).

The invention (8) is a PET device which detects radiation by utilizing the radiation detecting element according to any one of the inventions (1) to (6).

Effects of the Invention

1. By arranging the metal film to the radiation incident on the radiation detecting element so as to cause the incident radiation energy loss, the efficiency of carrier generation by incident radiation and the radiation detection efficiency can be improved.

2. Because the metal film of W, Pt, In, Fe, Pb, Cu or these alloys, or W/Pt, W/Pb, W/Fb, W/In, W/Cu or the laminated film of these alloy has high radiation blocking capability, and the radiation energy loss occurs in the thin film, the radiation detecting element can be effectively lightweighted and downsizing.

3. By utilizing the radiation detecting element with the intrinsic semiconductor substrate, the thickness of the depletion layer can be formed in the crystal. Recoil electrons generated by incident radiation are generated through the layer in intrinsic semiconductor region and depletion layer. When stop to move recoil electrons, generated many holes and electrons, improve the response speed and sensitivity of radiation detecting.

4. By utilizing the semiconductor detecting element having high radiation detection efficiency, it is possible to produce a radiation detecting device like PET system etc. having high sensitivity and high resolution.

Figure 1:
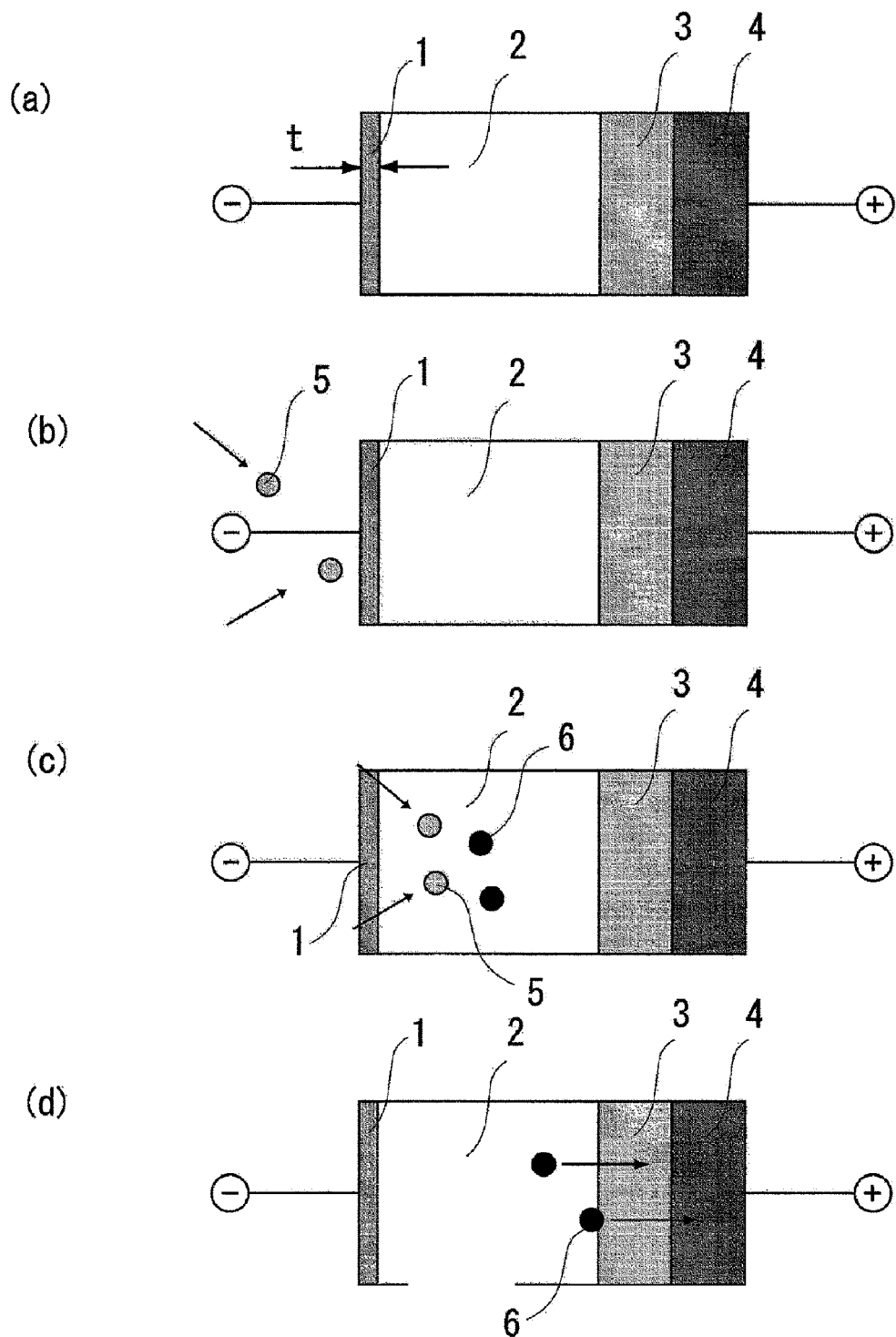
FIGS. 1 (a) and (d) is a cross-sectional view of the radiation detecting element of Schottky diode structure in accordance with the present invention.

EXPLANATION OF REFERENCE NUMERALS 1 electrode
2, 18 intrinsic semiconductor substrate
3, 17 N-type semiconductor layer
4, 16 ohmic electrode
5 gamma rays
6 electrons
11 ohmic electrode
12 N+ type semiconductor layer
13 semiconductor crystal
14 Schottky electrode
15 metal film
19 P-Type semiconductor layer
20 metal film
21 electrode
22 N+ type semiconductor layer
23 N-type semiconductor layer
24 P-type gate region
25 source electrode
26 insulating layer
27 shield film
31 crystals
32 radiation detecting element
33 electrode pad
34 bond wires
35, 36 radiation detector array
41 Radiation detecting diode
42 reset circuit
43 gamma rays detector
44 reset circuit unit
45 OR logic circuit
46 transfer circuit (Unit)
47 Computer
81, 85 crystal
82, 89 electrode
83 semiconductors
84, 87 Ohmic electrode
86 gamma rays
88 electrode stiffening plate
101 Schottky electrode
102 semiconductor crystal
103 Ohmic electrode
104 gamma rays

BEST MODE FOR CARRYING OUT THE INVENTION

Hereinafter, best mode of the present invention will be described.
<Radiation Detecting Element>
(Radiation Detecting Element Utilizing Semiconductor Element)

As a result of researching the cause of low sensitivity of radiation detecting elements utilizing semiconductor elements, the inventor found that the radiation has strong transmission power to the semiconductor, and has high probability to transmit the semiconductor not forming carriers. For example, in PET system, annihilation gamma rays, which generate when positrons and electrons are combined and annihilate, have high energy 511 kev, and then have very strong transmission power. It is profitable in the meaning that the ratio for the gamma rays generated from the radiation isotope distributed in the human body to arrive at the radiation detecting elements arranged out of the body is high. But there is a problem that it is difficult to achieve high sensitive detection, because the gamma rays permit the semiconductor substrate easily.

Figure 7:
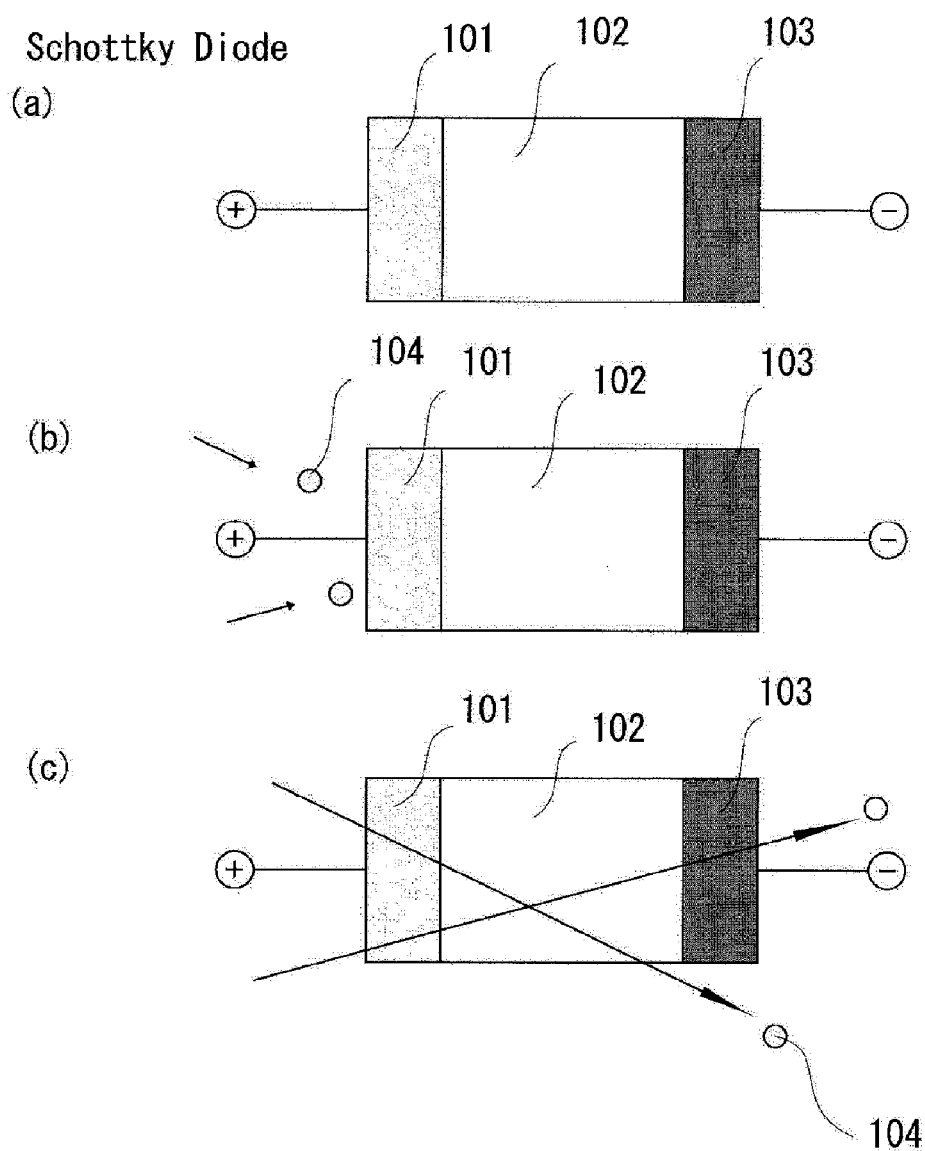
FIG. 7 (a) to (c) are cross-sectional views of the conventional radiation detecting element.

FIGS. 7 (b) and (c) show state when gamma rays are incident to conventional Radiation detecting elements. An electrode 101 comprised from InCdTe has no high radiation blocking capability. Therefore, the gamma rays 104 incident to the electrode 101 (FIG. 7(b)) easily pass through the electrode 101 and the semiconductor substrate 102 (FIG. 7(c)).

In order to solve this problem, an electrode comprised from metal like W etc., which has high radiation blocking capability, was decided to arrange on the radiation incidence side of the detecting element. And, thickness of a Schottky electrode was decided to be set to optimum range, in which the radiation detection efficiency is high. Also, an intrinsic semiconductor substrate was decided to be utilized as a semiconductor substrate.

FIG. 1 (a) is a cross-sectional view of a radiation detecting element according to the present invention. About radiation detecting element according to the present invention, for example, electrode 1 comprised from W is arranged on the radiation incidence side of the intrinsic semiconductor substrate 2 comprised from Si etc., and ohmic electrode 4 is arranged on the opposite side. On the surface of the intrinsic semiconductor substrate contacting to the ohmic electrode 4, N type semiconductor layer 3 is formed by doping N type impurities like P (phosphorus) etc.

In the radiation detecting elements that are configured as described above, the direction from the electrode 1 to the intrinsic semiconductor substrate 2 becomes the forward direction of the diode. Then when the bias voltage from the outside power source is added so that the ohmic electrode 4 has high electric potential compared to the electrode, a Schottky junction formed between the electrode 1 and intrinsic semiconductor substrate 2 becomes reverse bias, and depletion layer is formed. Thus, when no radiation is incident, only microelectric current like leakage current flows in intrinsic semiconductor substrate 2. Also, when the radiation is entered, the number of the incident radiation can be detected by measuring the pulse electric current generated according to the incident radiation.

Because the radiation detecting element according to the present invention has Schottky junction structure utilizing the intrinsic semiconductor region, leak current is largely reduced compared to the conventional Schottky junction structure not utilizing the intrinsic semiconductor region.

And, in the radiation detecting element of the present invention, metal film like W etc., in which radiation blocking capability is high, is utilized as the material of the electrode 1. It is different from the conventional radiation detecting element. Furthermore, the present inventor found that radiation detection efficiency can be drastically raised compared to the conventional radiation detecting element by controlling the thickness of the metal film to an appropriate range. Its mechanism has not yet been able fully understood. But it is conceivable that the energy loss occurs when the radiation passes through the metal film, and electrons are excited by the energy generated there. Also it is conceivable that the incident radiation energy on the semiconductor substrate is attenuated in the metal film, and a probability that carriers generate by the radiation excitation in the semiconductor substrate becomes higher. if the metal film is too thin, radiation energy loss or damping effect is not high. If the metal film is too thick, the number of radiation that can penetrate the metal film is remarkably reduced. On the other hand, if the thickness of the metal film is controlled to the adequate range according to the material, the efficiency of carrier generation by the incident radiation increases, and then detection efficiency is improved.

FIG. 1(b) to (d) are diagrams showing a state when the incident gamma rays are incident on the radiation detecting element according to the present invention. When the gamma rays 5 incident on the electrode 1 (FIG. 1(b)) passes through the electrode 1, its energy is attenuated. Being excited by incident gamma rays, carrier pairs consisting of electrons 6 and holes (not shown) are produced (FIG. 1(c)). A positive bias voltage is applied to the ohmic electrode 4, in comparison with the electrode 1. By the electric field formed by the bias voltage, electrons are moved toward the ohmic electrode 4, and the holes are moved to one side of the electrode. So a current flows in the intrinsic semiconductor substrate 2, and the incidence of radiation can be detected (FIG. 1(d)).

(Radiation Detection Efficiency Vs. the Thickness of the Metal Film)

Figure 2:
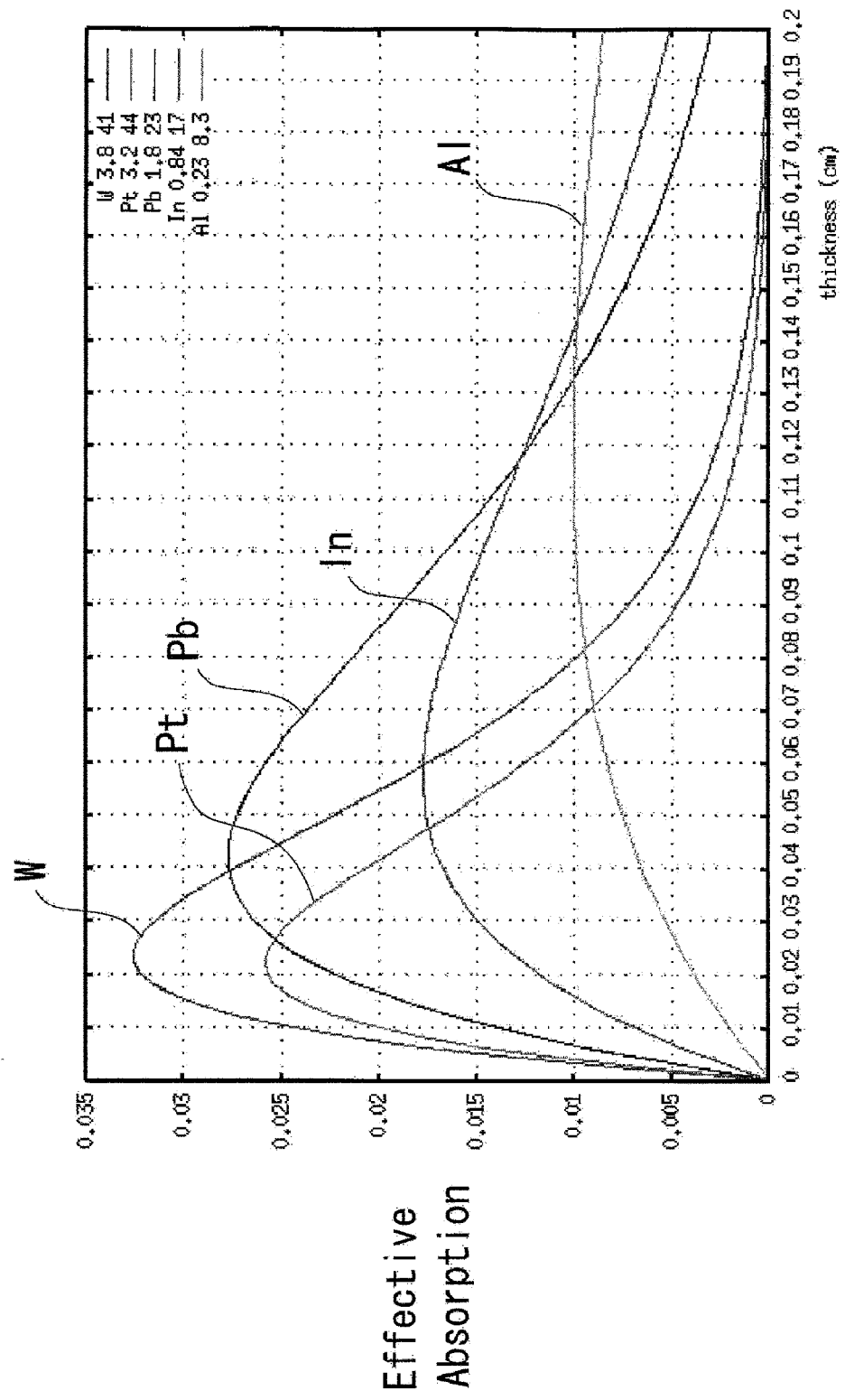
FIG. 2 is a graph showing the dependence of the radiation detection efficiency versus the thickness of the metal film.

FIG. 2 is the graph of the radiation detection efficiency vs. the thickness of the metal film by the radiation detecting element of the present invention. The detection efficiency is calculated using Cern Library, Gate (GEANT4 Application for Tomographic Emission). Radiation to be targeted to the detection supposes gamma rays of 511 KeV energy. Calculations performed for the case of using W, Pt, Pb, In, and Al as the material of the metal film. The calculated expression of the radiation detection efficiency y is approximated by $y=(1-\exp(-a*x))*\exp(-b*x)$. In this case, the thickness of the metal film is x (cm), the radiation absorption coefficient of metal is a (1/cm), and the average time to produce recoil electrons in the metal is b (cm).

As seen from the graph, detection efficiency y have maximum value ymax in the graph. Therefore, it is possible to calculate the values x1 and x2 satisfying the formula: $x1=x2=ymax/2(x1<x2)$. For example, When using W as a metal film material, ymax is equals to 0.0325, and then ½*ymax is equals to 0.01625. then x1 and X2 are calculated 0.005 cm and 0.050 cm respectively. From this result, by setting the thickness x of the metal film between 0.005 cm to 0.050 cm, i.e. by setting within half width, detection efficiency is value not less than 0.015. It shows that the detection efficiency can be improved significantly compared to conventional radiation detecting device.

And in the case of other metals (Pb, Pt, and In), the radiation detection efficiency can be improved, by setting the thickness in the half width of the maximum value in the plotting of the radiation detection efficiency versus thickness. As a result of the calculation about metals not shown in FIG. 2, we found that the improvement of the radiation detection efficiency is effective specifically in the case of W, Pt, In, Fe, Pb and Cu.

(Structure of the Radiation Detecting Element)

A radiation detecting element shown in FIG. 1 is the element having Schottky diode structure to describe below. A metal film is arranged in the radiation incident side on an intrinsic semiconductor substrate, and N-type semiconductor region or P-type semiconductor region is arranged in the opposite side. A depletion layer formed in the substrate can be thickened, by utilizing an intrinsic semiconductor substrate. Because recoil electrons generated by the incident radiation go through the intrinsic semiconductor region and the depletion layer and generate many holes and electrons, response speed and sensitivity of the radiation detecting can be improved. Therefore, regardless of the metal film thickness, it shows the detection characteristics superior to conventional radiation detecting elements not utilizing the intrinsic semiconductor substrate. And so it is possible to improve the characteristics of the radiation detector by setting the thickness of the metal to an appropriate range.

(Another Structure of the Radiation Detecting Elements)

The structure of the radiation detecting element is also possible with the structure of the Schottky diode structure without intrinsic semiconductor substrate. FIG. 3(a) shows a cross-sectional view of Schottky diode structure radiation detecting element without intrinsic semiconductor substrate. By not utilizing InCdTe but utilizing metal of W, Pt, In, Fe, Pb, or Cu etc. As Schottky electrode, and by optimizing the thickness of the film, the detection efficiency can be improved. It is possible for the metal film suppressing the radiation energy and the Schottky electrode to be produced as a combined utilization film (single layer film). Also as shown in FIG. 3(b), it is possible for the metal film and the Schottky electrode to be produced as a laminated film comprised from another material. In the case of the single layer film, it has the merit that producing process becomes easy. And, in the case of the laminated film, it has the merit that device design becomes easy, because the material appropriate for the radiation blocking capability can be utilized as the metal film, and the material having high workability and able to form appropriate Schottky junction for the semiconductor material can be utilized as the Schottky electrode.

Figure 3:
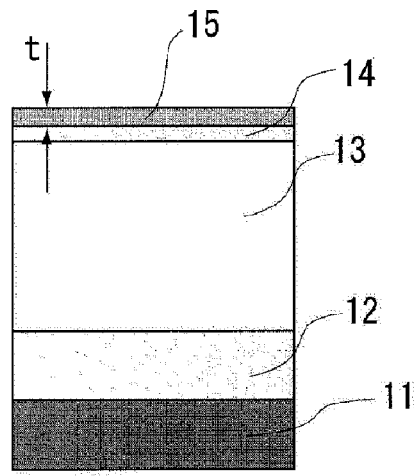
FIG. 3 (a) is a schematic of the cross-sectional view of another embodiment of the radiation detecting element with Schottky diode structure in accordance with the present invention. (b) is a cross-sectional view of radiation detecting element of PIN diode structure in accordance with the present invention. (c) is a cross-sectional view of Radiation detecting element SIT structure in accordance with the present invention.
Figure 3:
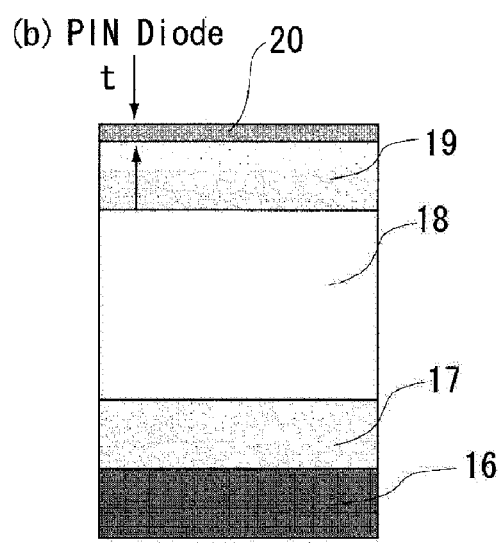
Figure 3:
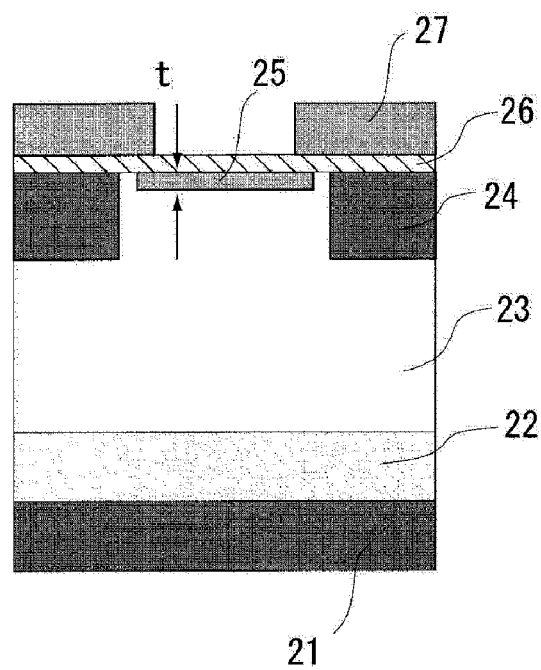

In FIG. 1, and FIG. 3 (a) it is described that the N-type semiconductor substrate is utilized, and the detecting element is the diode whose forward direction is from the radiation incident side to the Ohmic electrode. It is also possible to utilize P-type semiconductor substrate, and diode whose forward direction is from the Ohmic electrode to the radiation incident side. In this case, the detecting efficiency can also be improved by forming the metal film in the radiation incident side, and by controlling the thickness of the film in an adequate range.

(Detecting Elements Except Schottky Diode)

In addition to this Schottky diode, a PN junction diode, PIN diode, SIT and other device that can be used as radiation detecting devices in accordance with the present invention.

FIG. 3(b) is a schematic of the cross-sectional view of radiation detecting elements of PIN diode structure according to the present invention. In the radiation detecting element shown in FIG. 3(b), PIN diode is formed, for example, by arranging P-type semiconductor layer 19 on one surface of a intrinsic semiconductor substrate comprised from Si etc., and by arranging N-type semiconductor layer 19 on the other surface. The metal film 20 comprised from tungsten (W) is formed on the P-type semiconductor layer 19, which is the radiation incident side. A Ohmic electrode 16 comprised from aluminum (Al) etc. is formed on N-type semiconductor layer 17. Because the electrodes 20 are comprise from metal such as tungsten (W) etc., it is possible to improve the radiation detection efficiency by setting the thickness in the appropriate range. And about electrode 20, it is also possible to use laminated film of alloy of W/Pt, W/Pb, W/Fb, W/In, W/Cu or alloys comprised from these, not using a single-layer metal film as shown in FIG. 3(b).

FIG. 3(c) shows the cross-sectional view of the radiation detecting element of SIT (Static Induction Transistor) type according to the present invention. Radiation detecting element shown in FIG. 3(c) is formed by diffusion or ion implantation etc. of a P-type gate region 24 on the surface of a N-type intrinsic semiconductor substrate 23, for example comprised from N-type Si. Also, on the surface of the intrinsic semiconductor substrate 23 surrounded by P-type gate region 24, a source electrode 25 is formed by metal film, for example comprised from W. On the intrinsic semiconductor substrate 23, an insulation film 26 is deposited, and also a cover film 27 comprised from metal if formed in order to prevent radiation incidence. On the back of the intrinsic semiconductor substrate 23, a drain electrode 21 and an N+-type semiconductor region 22 for Ohmic contact are formed. The gate voltage applied to the gate region 24 is set so that PN junction between the gate region 24 and the intrinsic semiconductor substrate 23 becomes reverse bias. And a depletion layer is formed near the gate region 24. When the radiation is entered through the source electrode 25, the radiation incidence is detected by detecting change of the current flowing through drain electrode 21. Because the source electrode 25 is comprised from metal such as tungsten, it is possible to improve the radiation detection efficiency by setting the thickness of the metal in the appropriate range. About the source electrode 25, laminated film comprised from two or more metals or metal film obtained by diffusing N-type impurities on the N+ region in high concentration can be formed, in addition to the single layer film shown in FIG. 3(c).

In accordance with the present invention, each device structure of radiation detecting elements detects radiation, placing plural electrodes in the direction perpendicular to the incidence direction of the radiation. Thus, efficiency of collecting carrier generated by the radiation incidence is high compared with the case that plural electrodes are arranged in the horizontally direction with the radiation incidence.

(Material of Metal Film and Semiconductor Layer)

In accordance with the present invention, W, Pt, In, Fe, Pb, Cu or these alloys can be used as material of metal film of radiation detecting element. Also W/Pt, W/Pb, W/Fb, W/In, W/Cu or these alloys can be used as laminated film. W is specifically preferred as the metallic material of the metal film. Because W has high radiation absorption efficiency, and many electrons are generated by the radiation incidence even if the film is thin, it has an effect with detecting element's small light weighting.

And in the case of forming laminated film comprised from metal film/Schottky electrode as the radiation detecting element, for example, W/Pt, W/Pb, or W/Pb alloy can be utilized as the material of the film. Because W is difficult to process due to its high melting point, it becomes easy to manufacture the radiation detecting element by forming material film of Pt, Pb, or Pb alloy (solder) etc. on the surface bonded to semiconductor substrate.

Also in accordance with the present invention, Si, Ge, ZnO, CdTe, CdZnTe, SiC, GaN or GaAs etc can be used as the material of the semiconductor substrate of the radiation detecting element. For example ZnO can be processed into a film shape, it is possible to form a curved plate-like not only to form detecting devices.

<Radiation Detecting Device>

(Radiation Detector Array)

Figure 4:
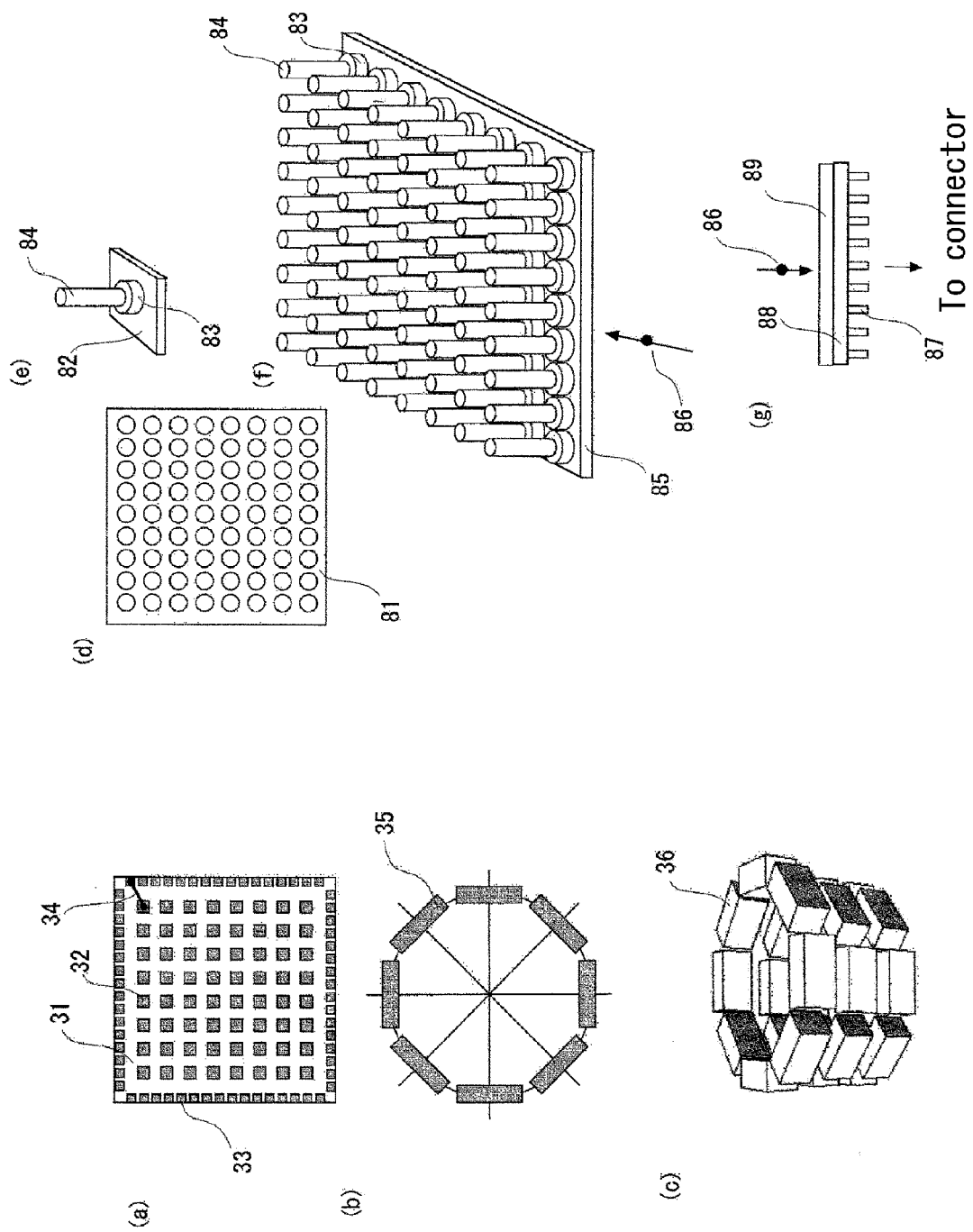
FIG. 4 (a) is a plane view of the radiation detector array. (b) and (c) are cross-sectional view and external view of the radiation detecting device, respectively. (d) to (g) are external view of other embodiments of the radiation detector array.

FIG. 4(a) shows a plane view of the radiation detector array element that makes up the radiation detecting device of the present invention. Radiation detector array is that plural radiation detecting elements are arranged on the surface of two-dimensional (2D) plane or curved substrate. FIG. 4(a) shows a radiation detecting elements of 8×8=64 spaced from each other on insulating crystal 31. The Schottky electrode on the radiation incident side is utilized as a common electrode. FIG. 4(a) shows a plane view from the Ohmic electrode side opposite to the Schottky electrode, and the pad 33 corresponding to the number of radiation detecting elements are placed around the substrate. The each pad 33 and the each ohmic electrode are electrically connected by a bond wires 34.

Detection unit of radiation detecting device in the usual manner has the structure that the plural radiation detector array is arranged around the analyte in the shape of a ring. By simultaneously detecting gamma rays emitted in opposite directions from the analyte by two radiation detector array arranged oppositely, the location and direction where the radiation is emitted can be identified. And, by laminating the plural radiation detector arrays arranged in a ring as shown in FIG. 4(b), a pipe-shaped detecting device can be constructed (FIG. 4(c)). The analyte like human body is entered in the pipe-shaped detecting device, and emitting radiation is measured. It is possible to display three-dimensional (3D) image density of the radiopharmaceuticals, by processing the detected signals.

FIGS. 4(d)-4(g) shows the external views of the other embodiment of the radiation detector array according to the present invention. In the system that the each pad arranged on the circumference of the substrate and the each detecting element's electrode are connected by the bonding wire as shown in FIG. 4(a), when N is increased, bonding becomes very difficult because the number of the N×N array's detecting elements increases by square. Other embodiment shown in FIGS. 4(d)-4(g) is the example of array structure that is available when the high-density implementation is necessary, for example, in the case that there are many detecting elements, or that detecting elements are microscopic.

FIG. 4(d) is the plane view of an electrode stiffening plate comprised from insulator, plural openings, on which detecting elements are arranged, are formed on the substrate 81. FIG. 4(e) is the external view of the detecting element. The detecting element is a Schottky diode comprised from an electrode 82, a semiconductor 83, and an Ohmic electrode 84. The electrode is comprised from metal W, In or Pb etc., and is the flat-board shaped electrode. On the electrode 82, the semiconductor 83 is formed. The semiconductor 83 is, for example cylindrical, and comprised from intrinsic Si/N-type Si etc. At the interface between the electrode 82 and the semiconductor 83, Schottky junction is formed. The Ohmic electrode 48 is the metal electrode, and for example pin electrode. The ohmic electrode 84 is arranged on the semiconductor 83, contacted through N+ region formed in the interface so as to form ohmic junction.

FIG. 4(f) is the perspective view of the radiation detector array which arranges plural radiation detecting elements on the substrate 85. FIG. 4(g) is its side view. The Schottky electrodes 83 of the plural detecting elements are the common electrode. On the other hand, the semiconductor 83 and the ohmic electrode 84 are arranged separately, and electrically separated. As shown in FIG. 4(g), the substrate 85 is formed by laminating a Schottky electrode 89 and a stiffening plate 88. When gamma rays are incident to the detecting element, electric current flows between the electrode 89 and the Ohmic electrode 87, and the detection of the gamma rays' incidence is executed.

But not shown in Figure, a shielding film or a cap comprised from metal W etc. may be arranged on the Ohmic electrode side of the radiation detecting element. In this case, the incidence of the radiation from the Ohmic electrode can be prevented, and then erroneous detection of the radiation can be prevented.

The radiation detector arrays shown in FIG. 4(f) may be directly installed on the substrate by pins arranged in the shape of the pinholders, or may be connected to interface like connector. In this case, the detecting signal can be sent to detecting circuit and control circuit, and then high-density implementation is able.

(Radiation Detection Signal Processing Circuit)

Figure 5:
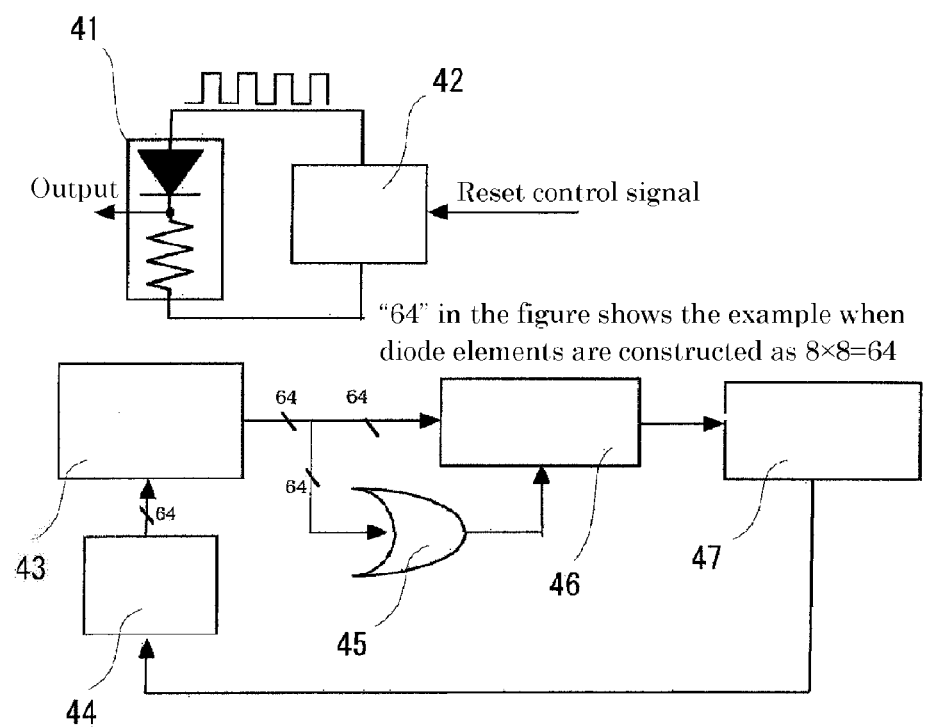
FIG. 5 is a block diagram of the radiation detection signal processing circuit.

The output of the radiation detecting element is analyzed by utilizing a signal processing circuit. FIG. 5 is the block diagram of the signal processing circuit. Output signal of the each radiation detecting element is directly connected to the signal processing circuit. Then, different from signal processing circuit like CCD, output signal of the each element can be simultaneously processed, and then highly precise image analysis is able.

In FIG. 5, a circuit block described with a radiation detecting diode 41 and a reset circuit 42 shows circuit of the respective detecting element. For example, the detecting element comprised from the Schottky diode can be shown as equivalent circuit comprised from diode and parasitism resistance as shown in the figure. When the radiation is entered to the detecting element 41, carrier comprised from electron and positive hole is generated, new carrier is generated by the collision between the carrier and semiconductor crystal lattice, and then electric current continuously flows in the diode by one time of the radiation intense. In order to distinguishably detect each radiation incidence, the reset circuit 42 is executed when the electric current is detected, and the electric current which flows in the diode is shut downed.

And, the whole radiation detecting device is shown by circuit block comprised from radiation detecting part 43, reset circuit part 44, OR logical circuit 45, transfer unit 46 and computer 47. The embodiment shown in the figure is the block diagram in which number of the radiation detecting elements is 8×8=64. The transfer unit 46 transfers the signal detected by the radiation detecting part 43 to the computer 47. The OR logical circuit controls not to transfer data when the detected electric current does not flow through all of the detecting elements. Signal processing by the computer 47 is executed for the detecting signal transferred by the transfer unit 46, and is shown, for example as a three-dimensional (3D) density image of the radiopharmaceutical to a display part which is not shown.

(Application of the Radiation Detecting Device)

Measurement subject of the present invention's radiation detecting device is not only gamma rays which is the measurement subject of the PET device, but also other radiation detecting, for example alpha rays, beta rays, neutron rays or X-rays etc. For other radiation detecting, high detecting efficiency can be obtained. As the applications of the radiation detecting device, the present application has high efficiency not only for the PET device, but also extensive field, for example radiation detecting element, image diagnosis device and imaging device etc. utilized in the field of nuclear medicine, atomic energy, astronomy and cosmic-ray physics.

EXAMPLE

The present invention is described with example below, but the present invention is not restricted to this.

Figure 6:
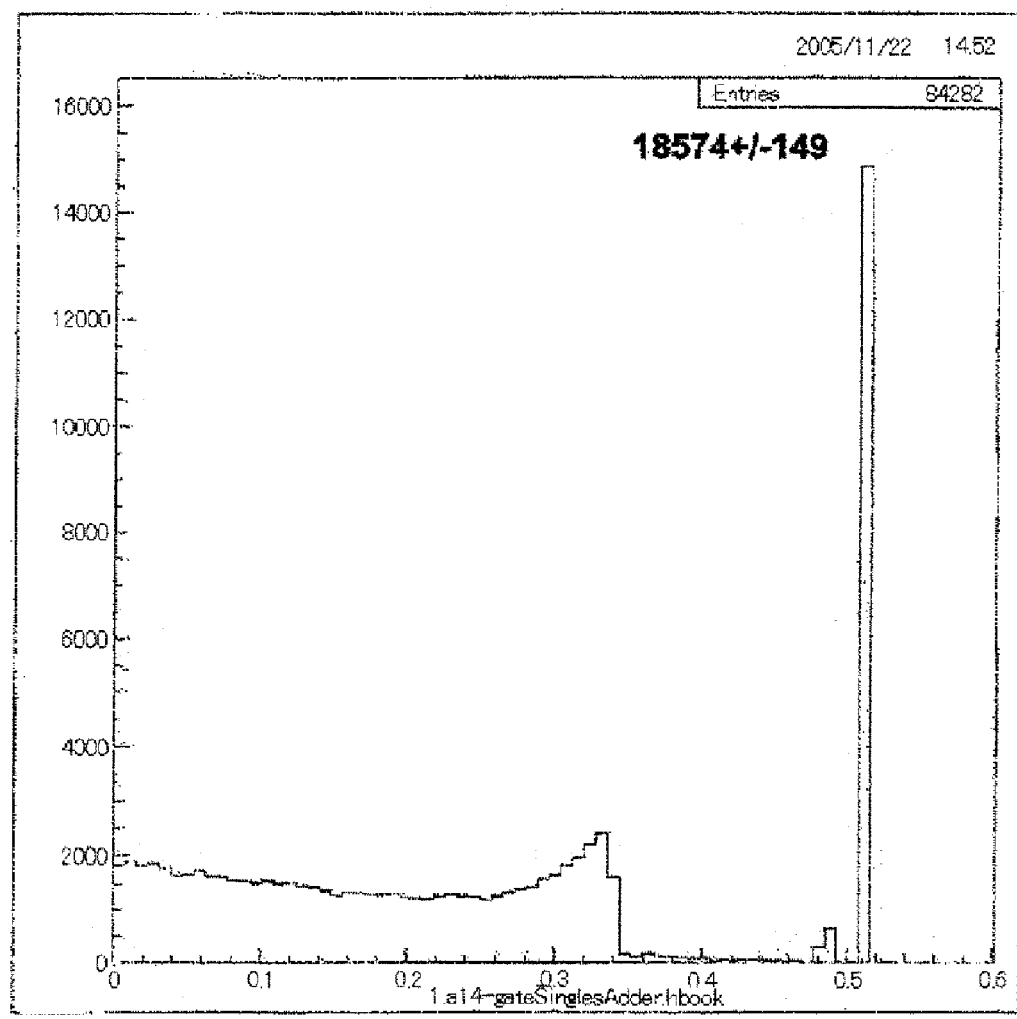
FIG. 6 (a) to (c) are examples of simulation results of the radiation detecting sensitivity.
Figure 6:
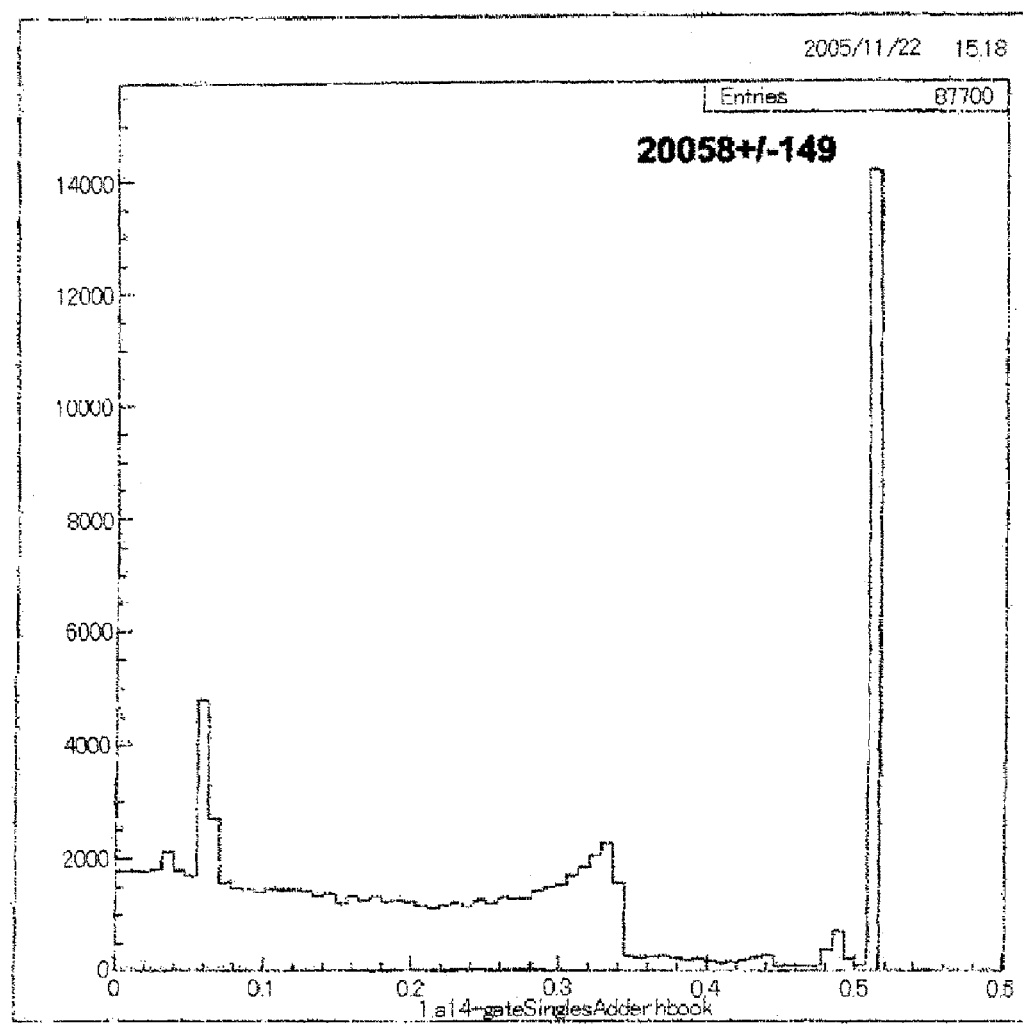
Figure 6:
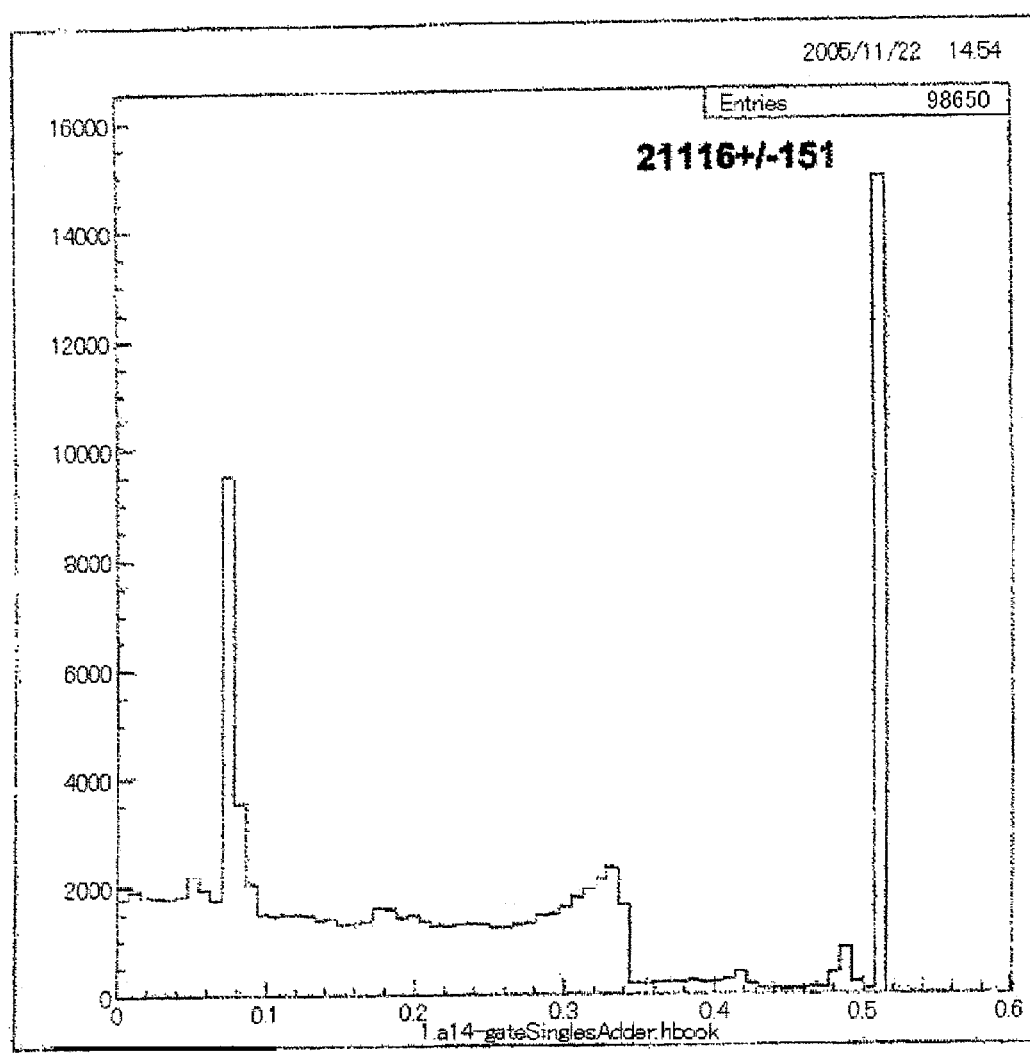

FIG. 6(a) to 6(c) show the simulation results of the radiation detecting sensitivity. In the simulation, following radiation detecting model, in which three kind of experiment materials are placed 10 mm away from a source 18F (isotope 18 fluorine, injection for PET) of diameter 4 mm and thickness 0.2 mm, was utilized. 74,000,000 (event number) annihilation gamma rays were generated from the source, the number of the gamma arrays collided to the experiment material was calculated by Monte Carlo method, and the detected number (count number) of gamma arrays having respective energy values was calculated by Monte Carlo method. Histogram shown in FIG. 6 was derived, by memorizing the radiation detecting sensitivity (count number) to the vertical line, memorizing the energy value to the horizontal axis, and dividing energy value 0 to 600 kev in 128. The detecting sensitivity at energy value 511 kev was shown with bold-faced number at the top right corner of the graph.

FIG. 6(a): (Conventional example) Only CdTe (thickness 1 mm), Detecting sensitivity 18574 FIG. 6(b): (Present invention) W (thickness 0.1 mm)/CdTe (thickness 1 mm), Detecting sensitivity 20058 (increased about 10% compared to the conventional example) FIG. 6(c): (Present invention) Pb (thickness 0.1 mm)/CdTe (thickness 1 mm)/Pb (thickness 1 mm), Detecting sensitivity 21116 (increased about 20% compared to the conventional example) From the above simulation results, it was indicated that the detecting sensitivity is largely increased with 10% to 20% by utilizing the present invention's radiation detecting element.

And if the detecting sensitivity is increased 20% for one radiation detecting element, the detecting efficiency of the PET is calculated square of 1.2, and the detecting sensitivity is increased 44%, because the radiation detecting elements are arranged both sides of the radiation source in the case of PET.

INDUSTRIAL APPLICABILITY

As described above, the present invention arranges the metal film on the radiation incident side of the radiation detecting element so as to cause the energy loss of the incident radiation. Then the carrier generation efficiency is improved, and the radiation detection efficiency can be improved.

The invention claimed is:

1. A radiation detecting element, comprised of:
an n-type semiconductor substrate or a p-type semiconductor substrate; and
an electrode arranged in the radiation incident side on the n-type semiconductor substrate or the p-type semiconductor substrate,
wherein the electrode is one of a metal film or a laminated film including the metal film, and
wherein, with x (cm) defined as a thickness of the metal film, a (1/cm) defined as a mass attenuation of the metal of the metal film, and b (cm) defined as a mean range of a generated recoil electron in the metal of the metal film, the thickness x (cm) is arranged in a range of a half-width of an approximated radiation detection efficiency of the radiation detecting element defined as $y=(1-\exp(-a*x))*\exp(-b*x)$.

2. The radiation detecting element according to claim 1, wherein an intrinsic semiconductor substrate is arranged between the n-type semiconductor substrate or the p-type semiconductor substrate and the electrode.

3. The radiation detecting element according to claim 1, wherein the radiation is gamma ray or X-ray.

4. The radiation detecting element according to claim 1, wherein the metal of the metal film is selected from the group consisting of W, Pt, In, Fe, Pb, Cu, and an alloy of any of W, Pt, In, Fe, Pb, and Cu.

5. The radiation detecting element according to claim 1, wherein the laminated film is formed of metals selected from the group consisting of W/Pt, W/Fe, W/In, W/Cu, and alloys of any of W/Pt, W/Fe, W/In, and W/Cu.

6. A radiation detecting device which detects radiation by utilizing the radiation detecting element according to claim 1.

7. A PET device which detects radiation by utilizing the radiation detecting element according to claim 1.

8. The radiation detecting element according to claim 3, wherein the metal of the metal film is selected from the group consisting of W, Pt, In, Fe, Pb, Cu, and an alloy of any of W, Pt, In, Fe, Pb, and Cu.

9. The radiation detecting element according to claim 3, wherein the laminated film is formed of metals selected from the group consisting of W/Pt, W/Fe, W/In, W/Cu, and alloys of any of W/Pt, W/Fe, W/In, and W/Cu.

10. A radiation detecting device which detects radiation by utilizing the radiation detecting element according to claim 3.

* * * * *